United States Patent
Oury et al.

(10) Patent No.: US 9,383,121 B2
(45) Date of Patent: Jul. 5, 2016

(54) DEVICE FOR CONCENTRATING SOLAR RADIATION

(75) Inventors: Jean-Marc Oury, Paris (FR); Vincent Rigal, Sceaux (FR)

(73) Assignee: SOLAR PERFORMANCE ET DEVELOPPEMENT, Paris (FR)

( * ) Notice: Subject to any disclaimer, the term of this patent is extended or adjusted under 35 U.S.C. 154(b) by 899 days.

(21) Appl. No.: 13/500,188

(22) PCT Filed: Oct. 5, 2010

(86) PCT No.: PCT/FR2010/052098
§ 371 (c)(1),
(2), (4) Date: Apr. 4, 2012

(87) PCT Pub. No.: WO2011/042656
PCT Pub. Date: Apr. 14, 2011

(65) Prior Publication Data
US 2012/0192858 A1 Aug. 2, 2012

(30) Foreign Application Priority Data

Oct. 6, 2009 (FR) ...................................... 09 56964

(51) Int. Cl.
*F24J 2/38* (2014.01)
*F24J 2/07* (2006.01)
(Continued)

(52) U.S. Cl.
CPC .... *F24J 2/07* (2013.01); *F24J 2/06* (2013.01); *F24J 2/08* (2013.01); *F24J 2/38* (2013.01); *F24J 2/5266* (2013.01); *H01L 31/0547* (2014.12); *F24J 2/085* (2013.01); *F24J 2/54* (2013.01); *F24J 2002/075* (2013.01); *F24J 2002/5437* (2013.01); *F24J 2002/5458* (2013.01); *Y02E 10/41* (2013.01); *Y02E 10/47* (2013.01); *Y02E 10/52* (2013.01)

(58) Field of Classification Search
CPC ... F24J 2/38; F24J 2/06–2/08; F24J 2002/075
USPC .................................................. 126/581, 600
See application file for complete search history.

(56) References Cited

U.S. PATENT DOCUMENTS

| 2,967,249 A | 1/1961 | Quick |
| 4,022,185 A * | 5/1977 | von Hartitzsch ........... F24J 2/38 126/579 |

(Continued)

FOREIGN PATENT DOCUMENTS

| FR | 2531520 | 2/1984 |
| GB | 1562912 | 3/1980 |

(Continued)

OTHER PUBLICATIONS

International Search Report dated Jul. 26, 2010.

*Primary Examiner* — Kenneth Rinehart
*Assistant Examiner* — William G Corboy
(74) *Attorney, Agent, or Firm* — Sofer & Haroun, LLP

(57) ABSTRACT

A device (1) for concentrating solar radiation, having a concentrator means (2) suitable for concentrating solar radiation onto a concentration zone, and a receiver (3) for receiving solar radiation. The receiver (3) is connected to at least one element (4) suitable for deforming under the action of temperature, and referred to as a "thermo-deformable element", each thermo-deformable element (4), when the radiation coming from the concentrator means (2) is concentrated onto a concentration zone situated on said thermo-deformable element (4), being suitable for changing shape in such manner as to cause the concentration zone to move towards the receiver (3) or as to cause the receiver (3) to move towards the concentration zone, so that the device (1) makes it possible, for a given position of the sun, and under the action of the solar radiation, to move the concentration zone from an initial position situated on a thermo-deformable element (4) to a final equilibrium position situated on the receiver (3).

10 Claims, 5 Drawing Sheets

(51) Int. Cl.
 *F24J 2/06* (2006.01)
 *F24J 2/08* (2006.01)
 *F24J 2/52* (2006.01)
 *H01L 31/054* (2014.01)
 *F24J 2/54* (2006.01)

(56) References Cited

U.S. PATENT DOCUMENTS 4,091,799 A * 5/1978 Steiner .................. F24J 2/38
 126/581
4,226,502 A * 10/1980 Gunzler ........................ 126/574
4,476,854 A  10/1984 Baer
4,986,255 A  1/1991 Ito
2010/0275904 A1* 11/2010 Bathurst et al. ............... 126/600

FOREIGN PATENT DOCUMENTS

| | | |
|---|---|---|
| JP | 56162351 | 10/1981 |
| JP | 57049757 | 3/1982 |
| JP | 11125765 | 5/1999 |
| WO | 02084183 | 10/2002 |
| WO | 2006118912 | 11/2006 |

* cited by examiner

DEVICE FOR CONCENTRATING SOLAR RADIATION

RELATED APPLICATIONS

This application is a National Phase application of PCT/FR2010/052098, filed on Oct. 5, 2010, which in turn claims the benefit of priority from French Patent Application No. 09 56964 filed on Oct. 6, 2009, the entirety of which are incorporated herein by reference.

BACKGROUND

1. Field of the Invention

The present invention relates to a device for concentrating solar radiation. The concentration device of the invention enables solar radiation to be concentrated automatically towards a receiver.

2. Description of Related Art

Many techniques for producing solar energy use devices for concentrating solar radiation towards a receiver. Such devices make it possible to increase the irradiation of the receiver and to reduce its costs.

Such concentration devices use either concentration by reflection, by using a mirror, e.g. a parabolic mirror or a cylindro-parabolic mirror, or else concentration by refraction, e.g. by means of lenses. The receiver collects the solar energy, which is then used in the form of heat, e.g. for a thermodynamic power plant, or else in the form of light radiation, e.g. for a photovoltaic power plant. Some of such devices are steered relative to two axes, while others are steered relative to a single axis.

Generally, electric motors controlled by an electronic solar-tracking system are used to steer the device. On the basis of time of day and of the geographical position of a power plant, it is easy to define at any time the exact direction in which to point the concentration device. Often, a feedback mechanism is added that identifies the exact direction of the solar radiation relative to the direction in which the device is pointing, and that corrects the pointing of the device.

However, using electric motors suffers from drawbacks. In very large power plants, e.g. plants extending over several tens of hectares, the installation costs, and in particular the wiring costs are high. In small power plants, e.g. in power plants extending over several tens or several hundreds of square meters, the risks of a motor failing are high, and the power plant does not necessarily have a maintenance team present on site. In addition, electric motors require power that the power plant cannot supply directly. It must therefore be connected to the electricity supply grid not only as an electricity producer, but also as a consumer, or else it must be equipped with a battery.

Devices are also known that are arranged so that the solar radiation brings the receiver to the focal point of the concentrator, such as, for example, the device described in Document U.S. Pat. No. 4,476,854 that steers the concentrator by means of a fluid moving by evaporating.

However, such devices sometimes use equipment that is of limited reliability in the long term and that is of high cost.

OBJECTS AND SUMMARY

An object of the invention is to remedy those drawbacks.

The invention proposes an automatic device for concentrating solar radiation that is reliable and inexpensive, that is moved directly by the sun, and that does not require any electric motor.

The invention thus provides a device for concentrating solar radiation, which device comprises concentrator means suitable for concentrating solar radiation onto a concentration zone, and a receiver for receiving solar radiation.

In the device of the invention, the receiver is connected to at least one element suitable for deforming under the action of temperature, and referred to as a "thermo-deformable element", each thermo-deformable element, when the radiation coming from the concentrator means is concentrated onto a concentration zone situated on said thermo-deformable element, being suitable for changing shape in such manner as to cause the concentration zone to move, e.g. on the assembly comprising the thermo-deformable elements and the receiver, towards the receiver or as to cause the receiver to move, e.g. on the assembly comprising the thermo-deformable elements and the receiver, towards the concentration zone, so that the device makes it possible, for a given position of the sun, and under the action of the solar radiation, to move the concentration zone from an initial position situated on a thermo-deformable element to a final equilibrium position situated on the receiver.

In certain embodiments, the pointing device is separate from the main concentration device that it steers. The concentration zone of the pointing device is brought to an equilibrium, position that is not directly the equilibrium position of the main receiver, but that ensures that, said receiver is at the point of concentration of the main device. This is obtained by mechanical coupling between the pointing device and the main concentration device.

The equilibrium position of the concentration zone is stable, because the solar radiation concentration zone moving from the receiver towards a vicinity of the receiver causes the thermo-deformable element to be deformed, thereby causing the zone to move closer to the receiver.

Thus, by means of the presence of the thermo-deformable element(s), the device makes it possible to concentrate the solar radiation on the end(s) of the thermo-deformable element(s), on the receiver. The device is designed so that, in the presence of solar radiation, the only stable state is the state in which the radiation is concentrated on the receiver.

It should be noted that the system for pointing the solar radiation onto the receiver is entirely passive, because it does not need any energy supply or any motor. The number of moving parts is also reduced to a minimum. This makes it possible to reduce manufacturing and maintenance costs, and it eliminates the need for any adjustment operation after the device has been manufactured. It should also be noted that the position of the system for pointing the solar radiation onto the receiver does not depend on the general temperature or on the intensity of the solar radiation, but rather solely on the position of the zone where the solar radiation is concentration.

The concentration zone may be moved directly merely by the thermo-deformable element(s) moving and/or by the concentrator means moving, e.g. via connection means of the movement-amplification type between the thermo-deformable element (s) and the concentrator means.

In a first general solution, the receiver is connected to two thermo-deformable elements, each thermo-deformable element, under the action of an increase in temperature, being suitable for moving the receiver in a direction opposite from the direction in which the receiver is moved when the other thermo-deformable element is subjected to an increase in temperature.

Thus, in this first general solution, two thermo-deformable elements are used that are mounted in such a manner that they act in opposite directions. Their radiation-sensitive elements are mounted in end-to-end abutment.

The operating principle of the device is as follows. Outside the equilibrium position, the solar radiation is concentrated onto one of the thermo-deformable elements, which then deforms. The relative change in shape of the two elements moves either the receiver alone, or both the receiver and the concentrator means. This movement ceases only when the concentrated radiation also strikes the other thermo-deformable element, the action of which then counteracts the action of the first thermo-deformable element. The configuration of the steering device is designed in such a manner that, at equilibrium, the receiver is situated at the focal point of the concentrator means. At equilibrium, the two thermo-deformable elements are illuminated, optionally in different proportions.

Thus, in one embodiment, the receiver is connected to two thermo-deformable elements suitable for contracting under the action of an increase in temperature, one of the ends of each of the thermo-deformable elements being stationary, the other end being connected to the receiver.

In another embodiment, the receiver is connected to two thermo-deformable elements suitable for expanding under the action of an increase in temperature, one of the ends of each of the thermo-deformable elements being stationary, the other end being connected to the receiver, and to the concentrator means via a movement-amplification mechanism.

The thermo-deformable elements may then be gas or wax expansion cartridges.

Another general solution consists in using a single thermo-deformable element, the device then being designed in such a manner that, at equilibrium, the solar radiation is focused on one of the ends of the thermo-deformable element.

Thus, in one embodiment, the receiver is connected to a single thermo-deformable element suitable for contracting under the action of an increase in temperature.

When the thermo-deformable element(s) is/are suitable for contracting under the action of an increase in temperature, each thermo-deformable element may be a bimetallic strip.

The bimetallic strip advantageously comprises a central metal element having an undulating shape, and in which the crests of the undulations are covered with a metal having a coefficient of expansion greater than the coefficient of expansion of the central metal element.

In another embodiment, the receiver is connected to a single thermo-deformable element suitable for bending under the action of an increase in temperature, the concentration zone being moved by the concentrator means pivoting or sliding via a transmission system driven by the bending of the thermo-deformable element.

The transmission system may comprise a cable and a pulley. It may also comprise one or more rods. Other modes of transmission can easily be designed by the person skilled in the art, such as, for example, coupling via links.

In order to compensate for the elasticity of the thermo-deformable element(s), the distance between the concentrator means and the thermo-deformable elements is greater than the distance between the concentrator means and the receiver.

The concentration zone may move in one-directional or two-directional manner.

BRIEF DESCRIPTION OF THE DRAWINGS

Other characteristics and advantages of the present invention appear more clearly on reading the following description, given by way of non-limiting illustration, and with reference to the accompanying drawings, in which.

DETAILED DESCRIPTION

Figure 1:
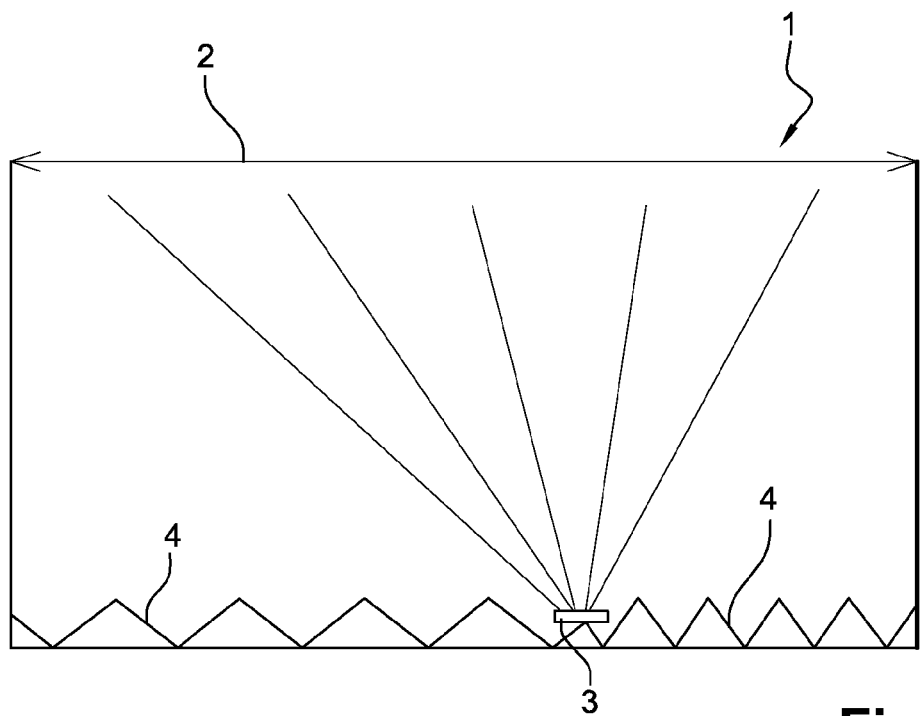
FIG. 1 diagrammatically shows a first embodiment of a device of the invention for concentrating solar radiation.

The device 1 for concentrating solar rays, as shown in FIG. 1, comprises a lens 2 that may be a conventional lens or a Fresnel lens, and a receiver 3 connected to two bimetallic strips 4. The bimetallic strips 4 are designed so that they become shorter in length when they are heated. These bimetallic strips 4 are good conductors of heat, so that it suffices to heat each of them intensely over a portion in order to obtain a significant shortening in its total length.

In this embodiment, the concentration zone on the receiver 3 is pointed by moving the receiver 3 in translation along the focal plane of the lens 2. The two bimetallic strips 4 are centrally interconnected, with their centers secured to the receiver 3. The other two ends of the bimetallic strips 4 are stationary. The right bimetallic strip 4 is illuminated, whereas the left bimetallic strip 4 is weakly illuminated.

In practice, the bimetallic strips 4 present elasticity. It is desirable to compensate for this elasticity. In a variant of the first embodiment, it is desired to illuminate the two bimetallic strips 4 unequally.

Figure 2:
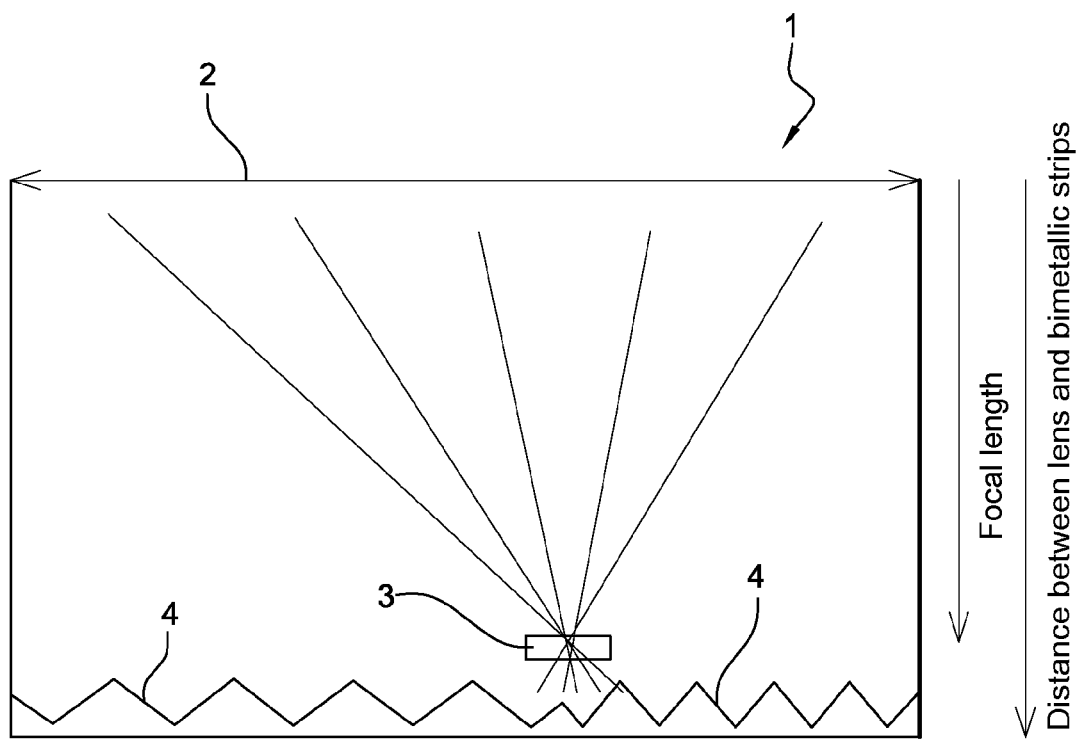
FIG. 2 diagrammatically shows a variant of the first embodiment of a device of the invention.

In order to manage this inequality accurately, it is possible to use a configuration such that the receiver 3 is at the focal point while one of the bimetallic strips 4 receives more radiation than the other receives. For this purpose, it suffices for the receiver 3 to be moved to a smaller extent than the extent to which the pointing device is moved, in a proportion that takes account of the elasticity. This applies, for example, if, in a first variant, as shown in FIG. 2, the distance between the lens 2 and the bimetallic strips 4 is greater than the focal length of the lens 2, i.e. greater than the distance between the lens 2 and the receiver 3.

In order to obtain improved pointing accuracy, it is also advantageously possible to place the interconnected ends of the bimetallic strips 4 outside the focal plane of the steering device. The solar radiation is then distributed more accurately between the two bimetallic strips 4 when the device is at the equilibrium point, because the image of the sun is spread a little. This also ensures that the junction point between the bimetallic strips 4 moves to a greater extent than the receiver 3, as in the above-described solution.

Figure 3:
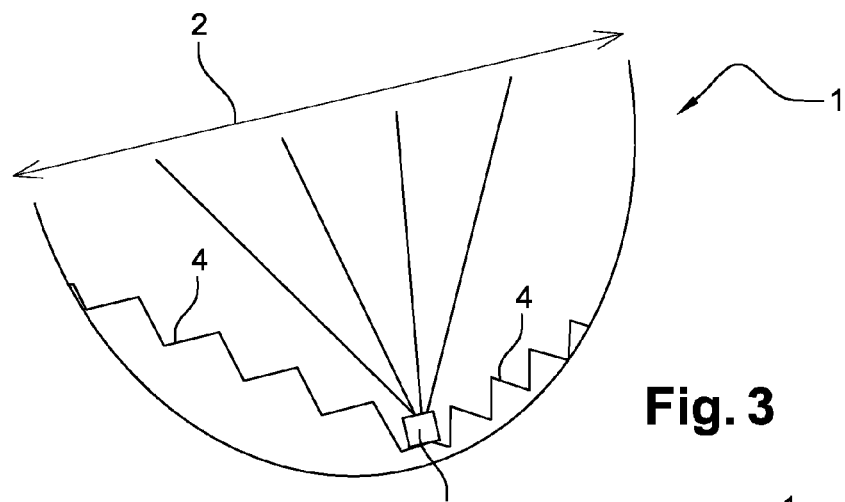
FIG. 3 diagrammatically shows a second embodiment of a device of the invention.

In a second embodiment, as shown in FIG. 3, in which elements identical to the elements shown in FIG. 1 bear like references, one end of each bimetallic strip 4 is stationary, and the two bimetallic strips 4 are interconnected via their other ends, which are also secured to a circular steering device. Two bimetallic strips 4 that shorten under the action of temperature are used.

This embodiment is the result of the first embodiment being transposed to steering by pivoting.

In a third embodiment, two thermo-deformable elements are used that expand with heat. For example, use is made of gas or wax cartridges, or of bimetallic strips that expand with heat.

Figure 4:
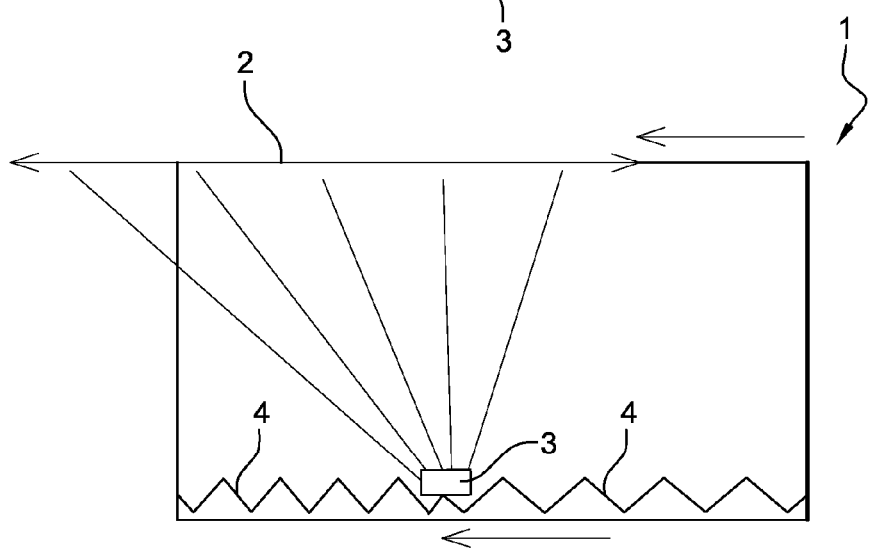
FIGS. 4 and 5 diagrammatically show a third embodiment of a device of the invention.

In this embodiment, as shown in FIG. 4, the ends of two cartridges 4 are stationary. The two cartridges 4 are centrally interconnected, with their centers secured to the receiver 3 and to the lens 2. By lengthening, a cartridge 4 thus moves the lens 2 towards the side opposite from the side on which the sun was initially focused. At equilibrium, the light is concentrated on the junction point between the two cartridges 4, which point is also the point at which the receiver 3 is situated. The right cartridge 4 is illuminated, whereas the left cartridge 4 is illuminated little.

Figure 5:
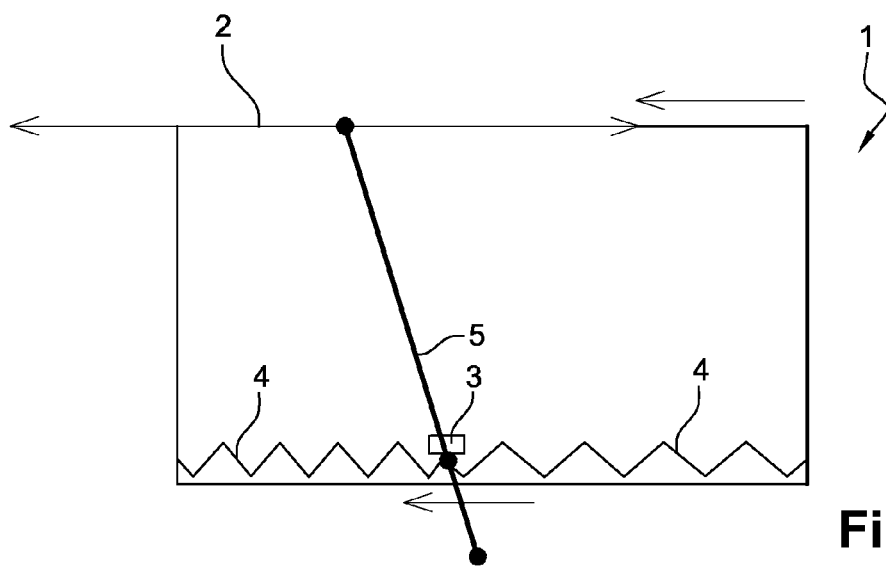

For geometrical reasons, the lens 2 must move to a greater extent than the receiver 3, in such a manner that the relative movement of the two elements has an effect on the focusing. This can be achieved by a movement-amplification mechanism, such as a lever 5, for example, as shown in FIG. 5. The lever 5 is fastened to the lens 2 and to the junction point between the cartridges 4.

The variants described for the first embodiment also apply to this embodiment.

An advantage of this third embodiment is that the cartridges are well-known devices, which are used, for example, for implementing thermostatically controlled valves. These devices are inexpensive, reliable, and accurate.

It is advantageously possible to use cartridges containing a liquefied gas, i.e. a gas that liquefies at ambient temperature, and that vaporizes when heated. An effect proportional to temperature is then replaced with an increase in volume caused by the mere fact of being heated, proportional to the exposure time. Such cartridges have apparent elasticity that is very low compared with the forces generated by the increase in temperature. Such cartridges also enable heat to be transferred well to them, which is favorable to major changes in length.

It is also possible to use cartridges that move to a small extent and that are coupled to a lens of short focal length. It is then possible to use movement amplification between the receiver and the concentrator. This embodiment may be used, for example, for steering concentrators that are cylindro-parabolic or that are of the large-size Fresnel lens type, such as the concentrators used for high-power power plants.

Figure 6:
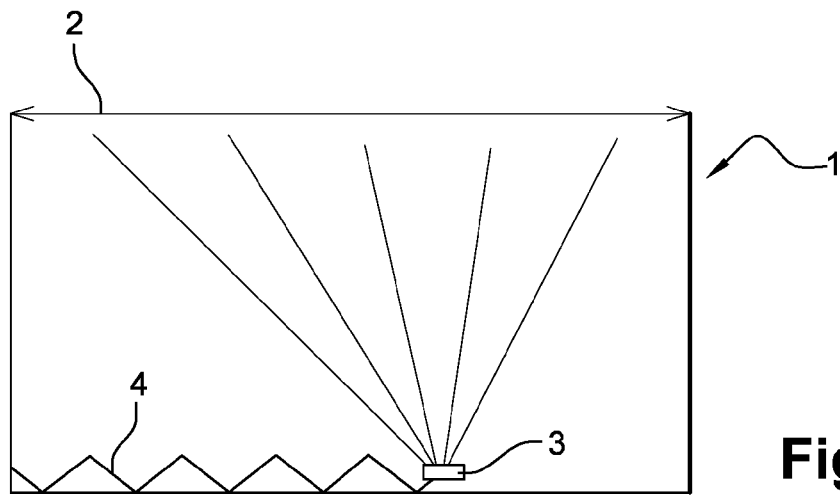
FIG. 6 diagrammatically shows a fourth embodiment of a device of the invention.
Figure 7:
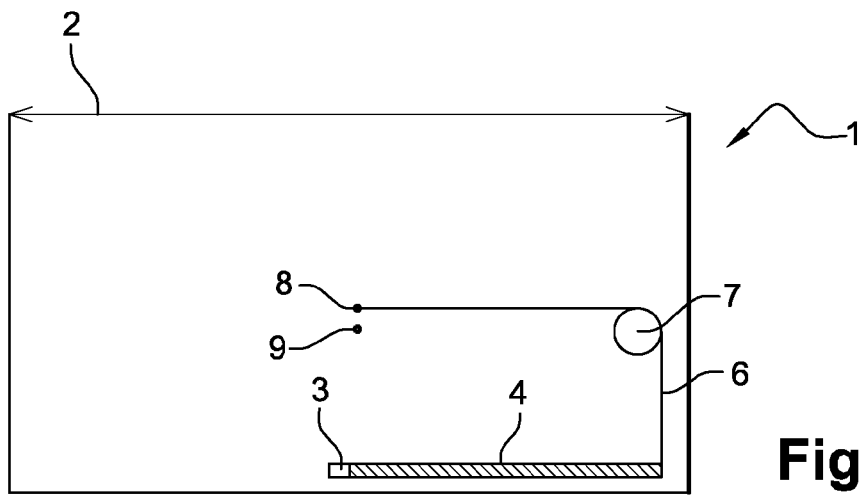
FIGS. 7 to 10 diagrammatically show a fifth embodiment of a device of the invention.

In a fourth embodiment, as shown in FIG. 6, a single thermo-deformable element is used that shortens under the action of temperature, e.g. a bimetallic strip 4. The receiver 3 is positioned at the end of the bimetallic strip 4. At rest, the bimetallic strip 4 is at its longest. As soon as it is illuminated, it shortens, until it receives the solar radiation at its end only. The stable equilibrium position is thus the position in which the light is focused on the end of the bimetallic strip 4.

Figure 12:
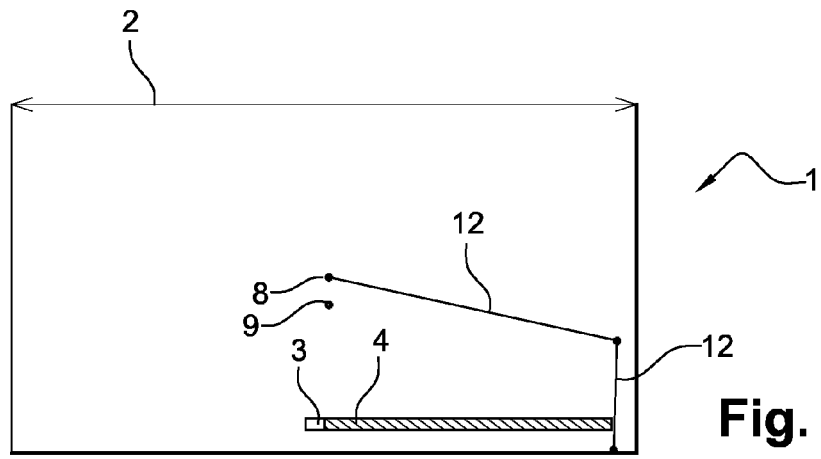
FIGS. 12 and 13 diagrammatically show a sixth embodiment of a device of the invention.
Figure 13:
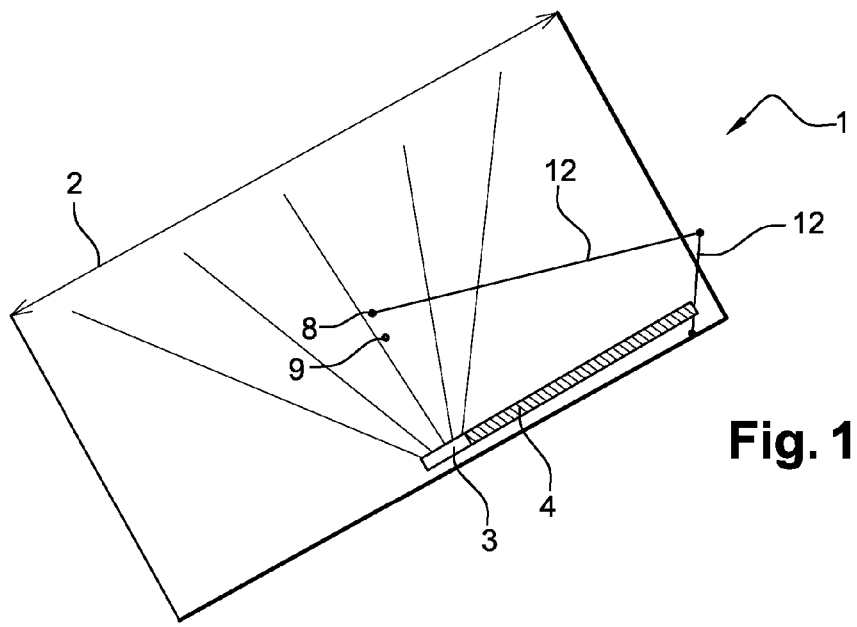

In a variant of this embodiment, as shown in FIGS. 12 and 13, a liquefied-gas cartridge 4 is used. As soon as the cartridge 4 is heated by the focused light, the liquid vaporizes and the length of the cartridge 4 increases. This lengthening leads to a change of direction of pointing. This phenomenon ceases when the concentrated light, reaches the end of the cartridge 4. The assembly is constructed in such a manner that the receiver 3 is then at the focus. FIGS. 12 and 13 show this embodiment, when steering is by pivoting by means of links 12. FIG. 12 shows the initial position of the cartridge 4, prior to lengthening, while FIG. 13 shows the final position of the cartridge 4.

As a general rule, the end of the thermo-modifiable device is designed with particular care, in order to ensure that the equilibrium point is as stable and accurate as possible.

It is possible, more generally, to design embodiments involving pivoting of the concentrator means. Unless the pivot axis is vertical, it is advantageous to make provision for said axis to pass through the center of gravity of the device of the invention. Such alignment reduces the force that the pointing device needs to deliver, and makes it unnecessary to correct the effects of gravity by changing the configuration of the pointing device. One of these embodiments is described below.

In this fifth embodiment, as shown in FIGS. 7 to 10, a single bimetallic strip 4 is used that bends under the effect of an increase in temperature. In this embodiment, steering by pivoting is chosen, applied to the entire pointing device, rather than merely to the receiver 3.

The bimetallic strip 4 is fastened to the center of the steering device, which center is the position in which the receiver 3 is located. The other end of the bimetallic strip 4 is situated beyond the furthest point that the solar radiation can reach. The radiation heats a particular point of the bimetallic strip 4, which bends. This, via a mechanical transmission system, causes the pointing device to pivot.

For reasons of simplification, FIGS. 7 to 10 use a transmission by a cable 6 attached to an external stationary point 8 and by a pulley 7, the pulley 7 being secured to the pivot axis 9 of the device 1. Other solutions are possible, e.g. replacing the cable 6 and the pulley 7 with a rod and a lever, or with a system having gears.

Heating the bimetallic strip 4 causes it to be deformed, thereby in turn causing the pointing device to pivot and thus causing the heating point to move. This movement causes the bimetallic strip 4 to act to a greater extent, because the deformation is applied to a longer length of the bimetallic strip 4. The stable equilibrium position is the position in which the radiation is focused on the end of the bimetallic strip 4.

Figure 8:
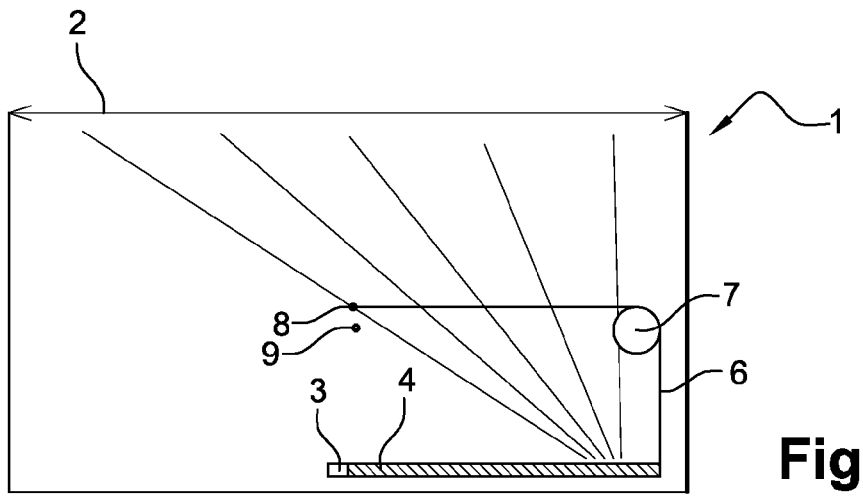
Figure 9:
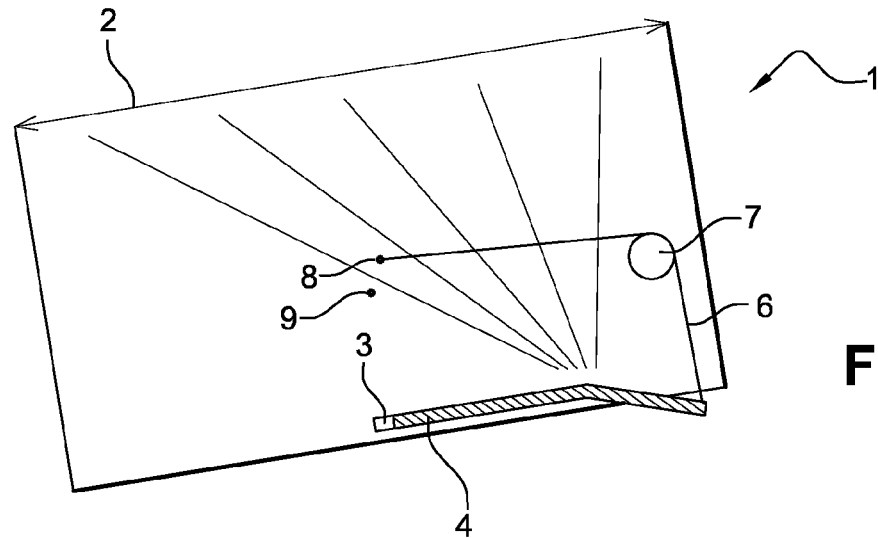
Figure 10:
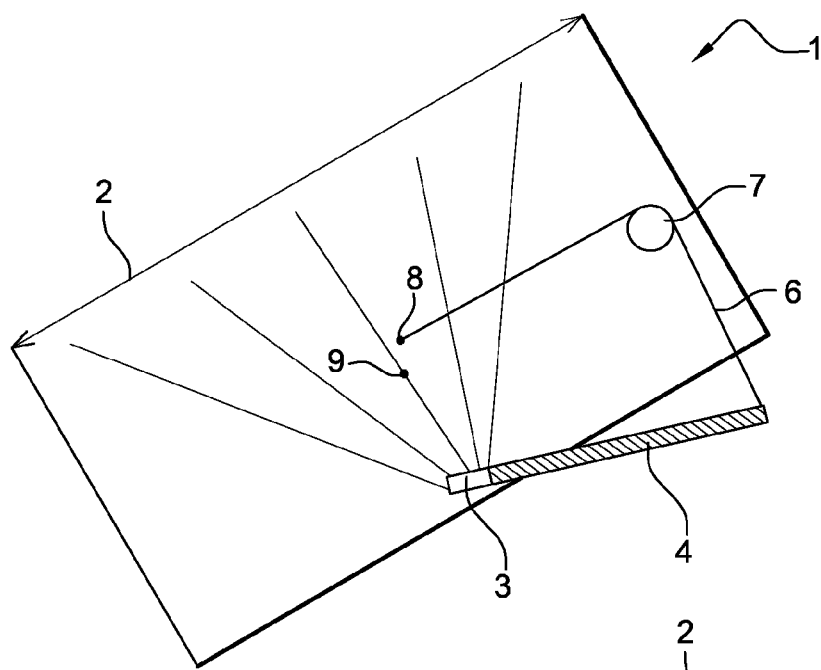

FIG. 8 shows the initial position of the device 1, before the bimetallic strip 4 bends. FIG. 9 shows an intermediate position, in which the bimetallic strip 4 is bent, and FIG. 10 shows the final position, when the radiation is focused on the receiver 3.

Figure 11:
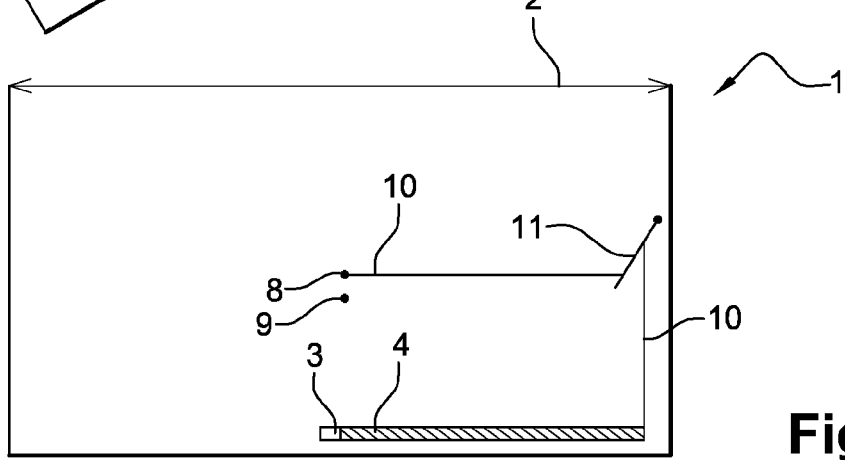
FIG. 11 diagrammatically shows a variant of the fifth embodiment of a device of the invention.

In a variant of this embodiment, as shown in FIG. 11, the bending of the metallic strip is transmitted by means of two transfer rods 10 co-operating with a link 11.

For greater clarity, the following explanations are limited to a device turning about a horizontal axis, extending east-to-west.

At rest, it is preferred to tilt the device at an angle that depends on its latitude. It is possible to design the device so that, at this angle, the end of the bimetallic strip is illuminated at sunrise. For this purpose, it suffices for the length of the bimetallic strip to be greater than the focal distance divided by the tangent of the angle at rest, the angle being measured relative to the horizontal. It is also generally necessary to avoid the angle at rest being greater than the maximum inclination of the sun relative to the horizontal.

This also applies to the other embodiments.

When the transmission is by cable and pulley, the device may advantageously be returned to its rest position under its own weight, provided that its center of gravity is not on the pivot axis. The rest position can then be achieved by means of an abutment. For a more rigid transmission, such as a rod, the center of gravity may advantageously be on the pivot axis.

Some of the above-described, embodiments use bimetallic strips that shorten when their temperature increases. It is also advantageous for the bimetallic strips to have low elasticity and high lengthening capacity. For this purpose, metallic strips that are spring-shaped may be used.

Figure 14:
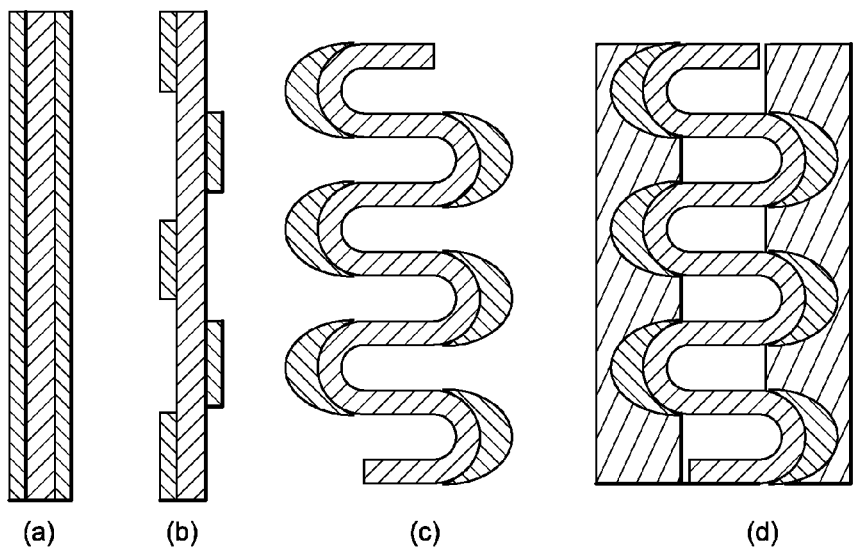
FIG. 14 diagrammatically shows various steps in a mode of manufacturing a bimetallic strip that can be used in a device of the invention.

As shown in FIG. 14, an easy way of manufacturing them consists in using a plate of a metal having a low coefficient, of expansion, and then in covering it over both of its faces with a metal having a higher coefficient of expansion (step (a)). The two faces are then machined in alternation, so that the central plate is covered by the second material on the left and on the right in alternation (step (b)). It then remains merely to shape the plate in the shape of bellows, each bend being covered with the insulating second material on its outside face (step (c)).

It is also possible to make provision for certain faces of the spring to be insulated, in order to increase the deformation of said spring (step (d)). Care is taken to ensure that this insulation does not limit the arrival of light, and does not excessively increase the stiffness of the bimetallic strip.

It is also possible to provide a reflective surface, behind the bimetallic strip, or more generally behind the thermo-modifiable element, or indeed around its side faces, in such a manner as to increase the effect of the focusing.

The above-described embodiments are examples of pointing relative to a single axis. The person skilled in the art will have no difficulty in imagining and constructing two-directional pointing devices using the characteristics of the invention for each dimension or for only one of the dimensions.

The above-described embodiments are also adapted to concentrating solar radiation by refraction. The person skilled in the art will have no difficulty transposing these embodiments to concentration by reflection, e.g. by using conventional parabolic reflectors or "Fresnel reflectors".

Certain concentration devices are made up of smaller elements, distributed repetitively in a plane, and forming a generating module. The pointing device can then be designed to steer the entire module, if it forms a mechanically integral whole.

Alternatively, when the concentrator means are individually steerable, it is possible to provide either a single pointing device causing all of the concentrator means to be moved, or one pointing device per concentrator means.

A particularly advantageous embodiment uses the configuration of one pointing device per concentrator means. Refraction concentration devices use lenses, which can be normal semi-cylindrical lenses or Fresnel lenses, each of which focuses the sunlight on a line situated in its focal plane. These concentration devices are disposed horizontally and they pivot about a horizontal axis, extending from east-to-west and passing through their centers of gravity. At its end, each device has a pointing device.

In this embodiment, the horizontal configuration of the concentration devices makes it possible for optimum use to be made of the sun in the morning and in the evening. The concentration devices are advantageously assembled into a module extending in a generally east-to-west direction, and that is inclined by 30° relative to the horizontal. Such a configuration maximizes the radiation collected, while minimizing the cost of the pointing device. It may be used for delivering energy to photovoltaic cells.

Another advantageous embodiment consists in using pointing devices to pivot mirrors, e.g. cylindro-parabolic mirrors or Fresnel mirrors that focus the solar radiation onto a tube containing a heat transfer fluid. In view of the weight of the cylindro-parabolic mirrors used for high-power power plants, it can be preferred to use cartridges, which are capable of generating large forces. As indicated above, it is possible to use a movement-amplification device.

As a general rule, and regardless of the embodiment, the accuracy of the pointing device depends on the shape and on the absorption characteristics of the surfaces of the thermo-deformable elements that receive the solar radiation, particularly around the point at which these elements are interconnected (for devices having two thermo-modifiable elements). It also depends on the heat conduction characteristics of the thermo-deformable elements, and on the respective heat conduction characteristics of the various elements. It is also advantageously possible to provide thermal insulation for the surfaces that are not designed to absorb radiation, e.g. in the form of a foam over the side faces and over the bottom portions of the bimetallic strips, or in the form of an appropriate choice of materials for the cartridges.

In order to improve accuracy, it is possible to use two-stage pointing. A first device then gives the general direction, and a second device provides precision pointing. One embodiment consists in performing general pointing using conventional electric-motor solutions, and then in performing final pointing in accordance with the invention. Another embodiment consists in using a device of the invention for both of the pointing stages.

The invention claimed is:

1. A device for concentrating solar radiation comprising:
a concentrator suitable for concentrating solar radiation onto a concentration zone; and
a receiver for receiving solar radiation,
wherein the receiver is connected to a single thermo-deformable element suitable for contracting under the action of an increase in temperature
the thermo-deformable element, when the radiation coming from the concentrator is concentrated onto a concentration zone situated on said thermo-deformable element, being suitable for changing shape in such manner as to cause the concentration zone to move towards the receiver or as to cause the receiver to move towards the concentration zone, so that the device makes it possible, for a given position of the sun, and under the action of the solar radiation, to move the concentration zone from an initial position situated on a thermo-deformable element to a final equilibrium position situated on the receiver.

2. The device according to claim 1, wherein said thermo-deformable element is a bimetallic strip.

3. The device according to claim 2, the bimetallic strip comprises a central metal element having an undulating shape, and in which the crests of the undulations are covered with a metal having a coefficient of expansion greater than the coefficient of expansion of the central metal element.

4. The device according to claim 1, wherein the distance between the concentrator and the thermo-deformable element is greater than the distance between the concentrator and the receiver.

5. The device according to claim 1, wherein the concentration zone moves in one-directional or two-directional manner under the action of a single thermo-deformable element for each direction according to which the concentration zone can move.

6. A device for concentrating solar radiation comprising:
a concentrator suitable for concentrating solar radiation onto a concentration zone; and
a receiver for receiving solar radiation,
wherein in said device, the receiver is connected to a single thermo-deformable element, suitable for expanding under the action of an increase in temperature, one of the ends of said thermo-deformable element being stationary, the other end being connected to the receiver, and said thermo-deformable element, when the radiation coming from the concentrator is concentrated onto a concentration zone situated on said thermo-deformable element, being suitable for changing shape in such manner as to cause the receiver to move towards the concentration zone, so that the device makes it possible, for a given position of the sun, and under the action of the solar radiation, to move the receiver, in translation along a focal plan of the concentrator, from an initial position to a final equilibrium position for which concentration zone is situated on the receiver.

7. The device according to claim 6, wherein the thermo-deformable element is either a gas or a wax expansion cartridge.

8. The device according to claim 6, wherein said thermo-deformable element is a bimetallic strip.

9. The device according to claim 6, wherein the distance between the concentrator and the thermo-deformable element is greater than the distance between the concentrator and the receiver.

10. The device according to claim 6, wherein the concentration zone moves in one-directional or two-directional manner under the action of a single thermo-deformable element for each direction according to which the concentration zone can move.

* * * * *